United States Patent [19]

Ohashi et al.

[11] 4,445,200

[45] Apr. 24, 1984

[54] MAGNETIC BUBBLE MEMORY DETECTION METHOD AND DEVICE

[75] Inventors: Makoto Ohashi, Tokyo; Kazunari Komenou, Kawasaki; Tsutomu Miyashita, Kawasaki; Kazuo Matsuda, Kawasaki; Yoshio Satoh, Yokohama, all of Japan

[73] Assignee: Fujitsu Limited, Kawasaki, Japan

[21] Appl. No.: 303,588

[22] Filed: Sep. 18, 1981

[30] Foreign Application Priority Data

Sep. 20, 1980 [JP] Japan ............................ 55-130082
Mar. 19, 1981 [JP] Japan ............................ 56-38748
Mar. 27, 1981 [JP] Japan ............................ 56-44116

[51] Int. Cl.³ .......................................... G11C 19/08
[52] U.S. Cl. ........................................ 365/8; 365/36
[58] Field of Search .................................. 365/8, 36

[56] References Cited

U.S. PATENT DOCUMENTS 3,820,089  6/1974  Lama ........................... 340/174 EB

OTHER PUBLICATIONS

IEEE Transactions on Magnetics—vol. Mag-15, No. 6, Nov. 1979, pp. 1905–1910.
Bell Systems Technical Journal—vol. 59, No. 2, Feb. 1980, pp. 229–257.
Elektronik, vol. 26, No. 10, Oct. 1977, pp. 103–106, Munich (DE); H. Huse, "Magnetblasenspeicher fur Mikroprozessor-Systeme", p. 103, right-hand column, lines 1–24; FIG. 1.
European Search Report of 2-5-83 by Examiner Degraeve at The Hague.

*Primary Examiner*—James W. Moffitt
*Attorney, Agent, or Firm*—Staas & Halsey

[57] ABSTRACT

A current stretch detection method for a bubble device in which bubbles are written at least one bit apart. A stretch pulse is applied to a stretch conductor so that when a bubble is detected, it is maintained stretched, even though the bubble following it has moved one bit. Preferably the stretch pulse is of a convex-shape. A bubble device has a hairpin stretch conductor and a detecting element disposed centrally in the conductor. The terminal of the detecting element on the higher potential side is arranged so that it does not cross the stretch conductor. The contiguous propagation pattern is provided with a notch at a position in which the stretch conductor is located.

7 Claims, 17 Drawing Figures

MAGNETIC BUBBLE MEMORY DETECTION METHOD AND DEVICE

BACKGROUND OF THE INVENTION

The present invention relates to a magnetic bubble memory device and, more specifically, to a bubble device with a current stretcher detector and a method of detection for this type of bubble device.

There is known an ion-implanted bubble device having a contiguous propagation pattern made by using an ion-implantation technique. Bubbles are written in the propagation pattern, with one for every bit or at least one bit apart, and moved successively bit by bit in response to a rotating drive field.

On the other hand, there is known a current stretcher detector, which includes a stretch conductor associated with a propagation pattern of a bubble device and operative, when applied with a stretch current, to stretch a bubble which reaches the detection position, and also includes a detecting element utilizing a magnetoresistance effect. This stretcher detector is principally used in the ion-implanted bubble device, but also can be used in a familiar Permalloy bubble device. The detection of bubbles by this stretcher detector is performed by applying a stretch pulse current to the stretch conductor in conjunction with the drive field, so as to stretch a bubble which reaches the detection position, and the stretched bubble can also be detected by the detecting element.

However, in a conventional detection method, a stretch pulse current is applied to every cycle of the drive field. Accordingly, there is a problem in that the efficiency of detection at a high frequency, for example 300 KHz, is low, as will be described in detail hereinafter.

Moreover, a conventional bubble device with a current stretcher detector has various problems in certain characteristics, which also will be described in detail hereinafter.

SUMMARY OF THE INVENTION

It is an object of the present invention to provide a detection method for a bubble device with a current stretcher detector, which provides a high efficiency of detection at a high frequency.

Another object of the present invention is to provide a bubble device with a current stretcher detector, in which various characteristics are improved.

The first object can be achieved by utilizing a bubble device in which bubbles are written in the propagation pattern at least one bit apart, that is, with one for every two or more bits. For example, in a familiar odd-even chip organization, bubbles are written at every other bit. This means that it is possible to complete the current stretch detection within two cycles of the drive field.

Therefore, the present invention provides a detection method for such a bubble device having a propagation pattern in which bubbles are written at least one bit apart and moved therealong successively bit by bit in response to a rotating drive field. In this method, a stretch pulse current is applied to the stretch conductor, so that a leading bubble which reaches the detection position is, when detected, maintained in that position to be stretched even though the succeeding or following bubble has moved one bit.

Preferably the stretch pulse is of a convex-shaped.

The present invention also provides a bubble device with a current stretcher detector which includes a hairpin stretch conductor and a detecting element disposed centrally in the stretch conductor, wherein a terminal of the detecting element on the higher potential side is arranged so that it does not cross the stretch conductor.

Further, the present invention provides a bubble device which has a contiguous propagation pattern, and which has a current stretcher detector, including a hairpin stretch conductor and a detecting element, wherein the contiguous propagation pattern is provided with a notch at a position in which the stretch conductor is located.

The present invention will now be described in detail based on preferred embodiments and in contrast with the prior art with reference to the accompanying drawings.

BRIEF DESCRIPTION OF THE DRAWINGS

FIGS. 14A and 14B illustrate an example of an ion-implanted bubble device with a current stretcher detector according to the present invention, wherein FIG. 14A is a plan view of a contiguous propagation pattern and FIG. 14B is a plan view of a current stretcher detector.

DETAILED DESCRIPTION OF THE PREFERRED EMBODIMENT

First, prior art will be described with reference to FIGS. 1 through 5.

Figure 1:
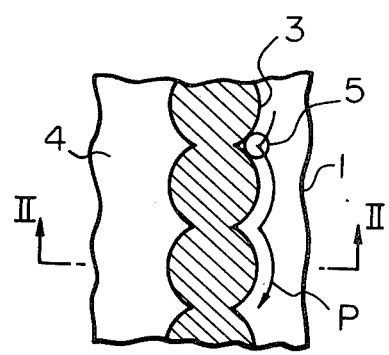
FIG. 1 is a partial plan view of an ion-implanted bubble propagation pattern.
Figure 2:
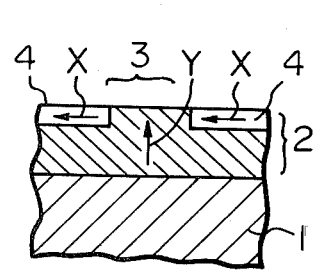
FIG. 2 is a sectional view taken along a line II—II in FIG. 1.

FIGS. 1 and 2 illustrate an ion-implanted bubble propagation pattern. A reference numeral 1 designates a substrate of gadolinium gallium garnet (GGG), on which a thin layer 2 of magnetic garnet is deposited by the method of liquid-phase expitaxial growth. The thin magnetic layer 2 has a first region 3, and a second remainder region 4 in which an ion, such as H, Ne or He is implanted. The second ion-implanted region 4 has an easy axis of magnetization, which is in the plane of the layer 2, as shown by the arrow X, and the first region 3 has an easy axis of magnetization which is normal to the plane of the layer 2, as shown by the arrow Y. A bubble 5 is moved along the periphery of the first region 3 in response to a magnetic field rotating in the plane of the layer 2. Therefore, the first region 3 defines a bubble propagation pattern. Such a propagation pattern, as mentioned above, is a contiguous pattern, which may be composed of a plurality of overlapping disk patterns or square patterns and, therefore, requires no gaps, unlike a conventional Permalloy pattern. This fact makes it possible to relax the pattern in geometry and, accordingly, it is possible to provide a smaller pattern and a higher density.

Figure 3:
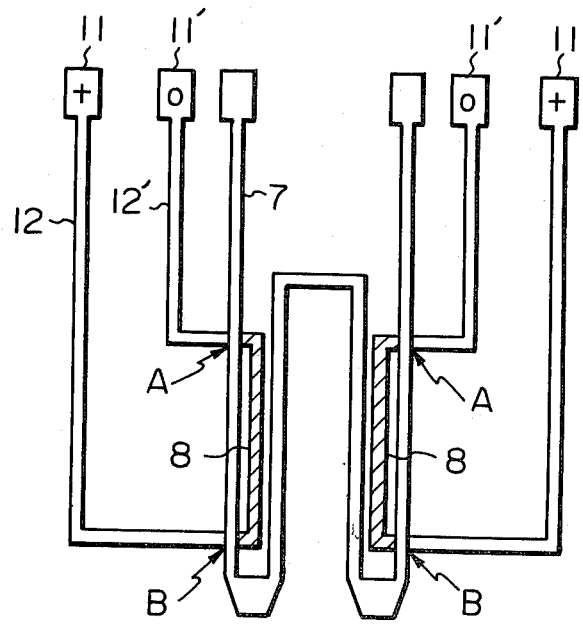
FIG. 3 is a plan view of a conventional current stretcher detector of an ion-implanted bubble device.
Figure 4:
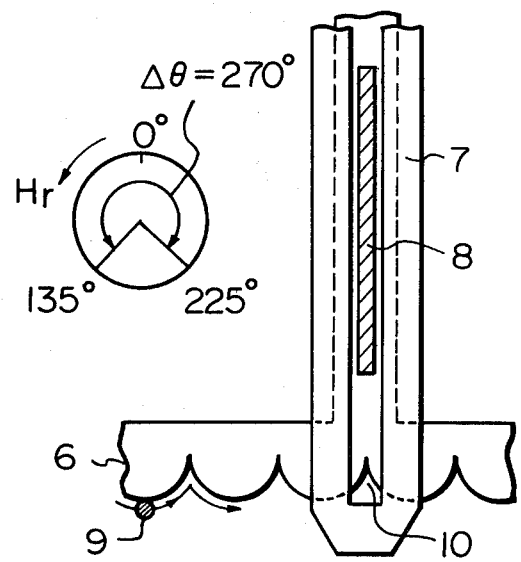
FIG. 4 is an enlarged partial plan view of the current stretcher detector in FIG. 3.
Figure 5:
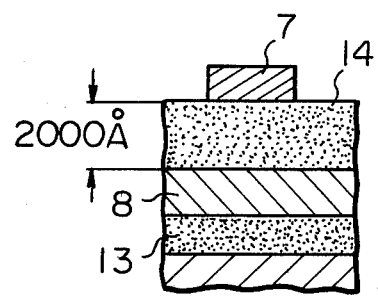
FIG. 5 is a sectional view of the portion designated by the reference A or B of the stretcher detector in FIG. 3.

FIGS. 3 through 5 illustrate a conventional current stretcher detector of an ion-implanted bubble device, which is a type that is provided with a dummy detector. Referring to FIG. 4, the reference 6 designates a contiguous half-disk propagation pattern. The current stretcher detector includes a hairpin-shaped stretch conductor 7 and a straight bar-shaped detecting element 8, which are disposed over the propagation pattern 6, with insulating layers 13 and 14 of $SiO_2$ interposed therebetween, as illustrated in FIG. 5. The conductor 7 is made of Au, for example, and disposed so that its hairpin loop surrounds a cusp 10 in the propagation pattern 6. The detecting element 8 is made of a Permalloy thin film having a thickness of 300 to 400 Å, and disposed centrally within the hairpin loop of the conductor 7.

The method of the current stretch detection will now be described. A bubble 9 is moved bit by bit in response to a counterclockwise rotating magnetic drive field Hr along the propagation pattern 6 from the left to the right, as indicated by an aroow. The following description will be based on a reference angle (0°) at which the drive field Hr is perpendicular to the propagation direction of the bubble and the bubble stays in a cusp. Each bubble is moved one bit during the rotation of the drive field Hr from 135° to 225°, and a bubble rests at the cusp during the rotation of the drive field Hr from 225° to 135°, through 360° (0°). The bubble detection is performed during the term of $\Delta\theta=270°$ in which the bubble stays in the cusp 10, during which time a stretch pulse current is applied to the stretch conductor 7 so that the bubble is stretched to a stripe domain and detected by the detecting element 8 by utilizing the magnetoresistance effect, and thereafter a destretch pulse current is applied to the stretch conductor 7 so that the stripe domain is shrunk back to a bubble or collapsed completely.

According to a conventional detection method, a stretch pulse current is applied to every cycle of the drive field. However, in this method, there is a problem that detection at a high frequency is difficult, as described below.

In the current stretch detection, the detection voltage or signal is proportional to the length of the stripe domain and the detection efficiency. The stripe domain length is proportional to the pulse width and the striping-out velocity. The detection efficiency is a function of the drive field amplitude and phase at the time of detection. It has been known that the detection efficiency is a maximum when the direction of the drive field Hr has rotated by 45° from the normal to the lengthwise direction of the detecting element 8. Therefore, the highest detection efficiency can be obtained by performing the detection when the direction of the drive field Hr is 135° or 315°.

For example, in the case in which a 1 μm bubble crystal is employed and the frequency is 100 KHz, one cycle is 10 μs, and the angle $\Delta\theta=270°$ where the bubble stays in a cusp corresponds to 7.5 μs. On the other hand, if the length of the detecting element 8 is 100 μm and the bubble striping-out velocity is 60 m/sec, the bubble is stretched to a stripe domain of 100 μm in 1.7 μs. Therefore, if a stretch pulse is applied during the period of 225° through 315°, which corresponds to 2.5 μs, the requirements as mentioned above are satisfied, and, in fact, 7 mV of detection voltage and $\eta=0.44\%$ can be obtained.

However, detection at a high frequency is difficult. If the frequency is 200 KHz or 300 KHz, one cycle is 5 μs or 3.3 μs, respectively, and the time corresponding to $\Delta\theta=270°$ where the bubble stays in a cusp is reduced to 3.75 μs or 2.5 μs, respectively. Therefore, there is not sufficient time to stretch the bubble, and the stretch pulse must have a width beyond the phase of Hr=315° for maximum detection efficiency. Moreover, if a stretch pulse has a duration long enough for the drive field Hr to assume a phase of 135°, at which time the bubble starts to move toward the next cusp, there is no time to shrink the bubble back to its original shape or to collapse the bubble completely. Furthermore, when the duty is taken into consideration, the width of the stretch pulse can be as long as 225° (62.5%) which may possibly cause the stretch conductor to break down.

The ion-implanted bubble device, as mentioned above, has a problem in that nucleation of the bubble is easily caused by the stretch pulse current applied to the stretch conductor 7. This bubble nucleation causes errors to result during bubble detection. This fact makes it difficult to increase the stretch pulse current and, therefore, it is also difficult to increase the detection voltage.

Moreover, the current stretcher detector mentioned above is poor in durability. Referring to FIG. 3, the detecting elements 8 are connected to terminals 11 and 11' through leads 12 and 12'. The leads 12 and 12' cross the stretch conductor 7 at the portions A and B. The distance between the stretch conductor 7 and the lead 12 or 12' at the crossing portion A or B is 2000Å, which is the thickness of the insulating layer 14. A direct current of 2 to 3 mA for detecting a bubble by utilizing a magnetoresistance effect is applied to the detecting element 8. Accordingly, 1 to 1.5 V of the electric potential appears across the detecting element 8. Since the crossing portion A is on the lower potential side, the potential at the portion A is 0 V, but the potential at the portion B is 1 to 1.5 V. Although a pulse current is applied to the stretch conductor 7, the potential thereof is substantially 0 V. Therefore, a strong electric field is generated at the portion B, because the insulating layer 14 is thin (1 V/2000 Å=50 kV/cm). This possibly results in causing the insulating layer 14 to break down, thereby causing a breakage of the detecting element 8.

The present invention is constructed to eliminate the above-mentioned problems found in conventional methods and devices. The preferred embodiments of the present invention will now be described with reference to FIGS. 6A through 15.

Figure 6A:
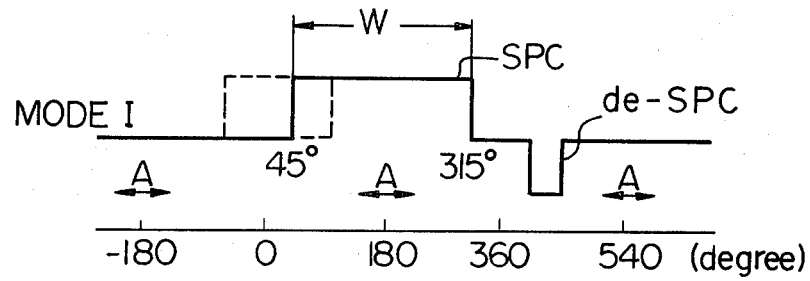
FIGS. 6A and 6B are waveform diagrams illustrating pulses according to the present invention.
Figure 6B:
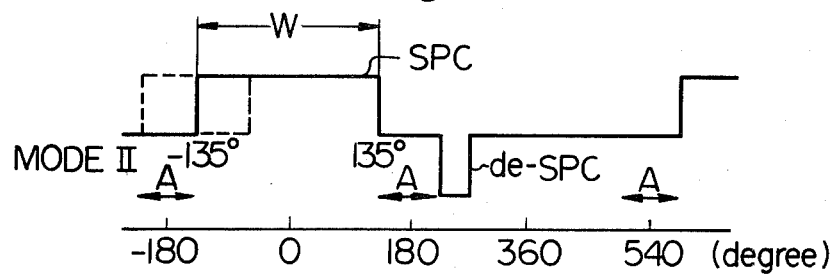

The present invention provides a highly efficient detection method by utilizing a chip organization in which bubbles are written in the propagation pattern at least one bit apart. According to the method of the present invention, a stretch pulse current is applied to the stretch conductor every two or more cycles of the drive field, depending on: the duty at a high frequency; the pulse width of the stretch current; the direction of the drive field at the time of detection; and the time required for completely collapsing the bubbles. FIGS. 6A and 6B illustrate waveforms of a stretch pulse current (SPC) and a destretch pulse current (de-SPC) when applied every two cycles of the drive field at a frequency of 300 KHz.

Referring to these figures, the pulse width W of the stretch pulse is determined by the time "t" which is required to stretch a bubble to the length "l" of the detecting element. If the striping-out velocity of the bubble is "v", there is a relation $t \geq l/v$. In the case of v=50 m/sec and the length "l" is 100 μm, the time "t" is 2 μs. If the time "t" is determined as 2.5 μs with a margin, 2.5 μs corresponds to an angle of 270°, since one cycle is 3.33 μs when the frequency "f" is 300 kHz.

As described hereinbefore, the detection voltage is a maximum when the direction of the drive field is 135° or 315°. Therefore, if the bubble is stretched sufficiently by the stretch pulse current when the drive field is in either one of these directions, the maximum detection voltage can be obtained. In other words, the optimum fall phase of the stretch pulse is 135° or 315°. Accordingly, there are two modes in the stretch pulse. In mode I illustrated in FIG. 6A, the stretch pulse falls at 315°, and in mode II illustrated in FIG. 6B, the stretch pulse falls at 135°.

Figure 7:
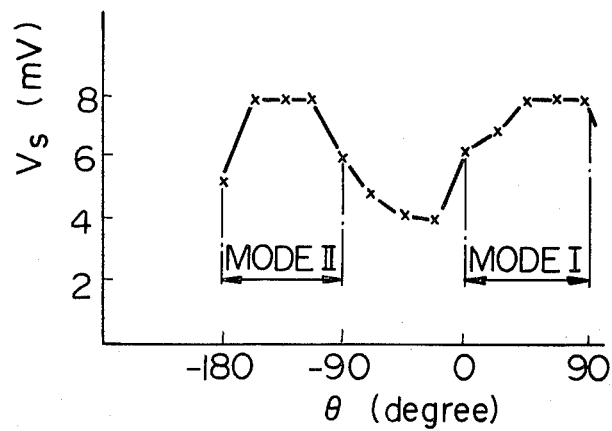
FIG. 7 is a graph illustrating a change of a detection voltage in relation to a rise phase of a stretch pulse current.

Since the rise of the stretch pulse may be 270° ahead of the fall, the stretch pulse may rise at 45°=315°−270° in mode I and, on the other hand, at −135°=135°−270° in mode II. However, there are phase margins as large as −70° to 100° and −225° to −70° in modes I and II, respectively. The normal operation range is 0° to 90° in mode I and −90° to −180° in mode II, as illustrated in FIG. 7. In FIG. 7, the detection voltage $V_S$ with respect to the rise phase $\theta$ of the stretch pulse (pulse width is constant) is plotted based on a bubble device under a condition that the stretch pulse current is 50 mA. The normal operation range is a range wherein the detection voltage is 6 mV or more.

A range "A" in FIGS. 6A and 6B designates a bubble propagation phase. In mode II, the stretch pulse may rise during the bubble propagation. In this case, however, the stretch pulse current acts to take the bubble into the loop of the stretch conductor and causes no trouble. On the other hand, the destretch pulse current (de-SPC) for shrinking and collapsing the bubble may be applied during the period of time between the fall of the stretch pulse and the beginning of the subsequent bubble propagation. This period of time is 1.67 μs corresponding to 180° C.=495°−315° in mode I and, on the other hand, 3.33 μs corresponding to 360°=495°−135° in mode II, thereby providing sufficient time to collapse the bubble.

Moreover, the duty is as low as 37.5% (=270°/720°) and does not impose a high load on the stretch conductor.

Using the method of the present invention, the width of the stretch pulse can be widened two or more times compared to that in the conventional method. The detection voltage obtained at 300 kHz is 8 mV, which is comparable to the value at 100 kHz.

The relationship of the detection voltage to the bias field in mode I is superior to that in mode II. Other operating characteristics in both modes are almost the same.

However, the method described above has disadvantages. The high end of the bias field margin at a low stretch current is limited by insufficient striping out. Failure at a large stretch current is caused by the influence of the stretch pulse when the collapse of a bubble occurs at the bit location adjacent to the detector.

According to the present invention, these disadvantages can be overcome by using stretch current having main and auxiliary pulses.

Figure 8:
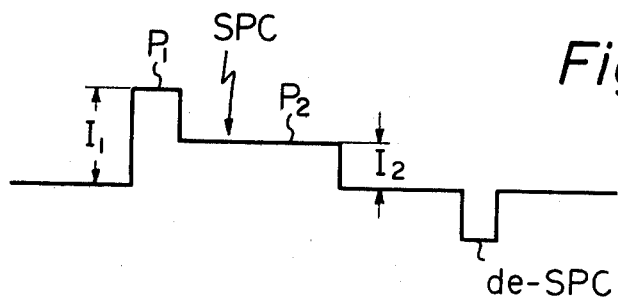
FIG. 8 is a waveform diagram of a convex-shaped pulse according to the present invention.

FIG. 8 illustrates a waveform of a stretch pulse (SPC) and a destretch pulse (de-SPC) which are employed in the current stretch detection method of the present invention. The stretch pulse is composed of a main pulse $P_1$ having a value of current $I_1$ and an auxiliary pulse $P_2$ coming after the main pulse $P_1$ having a value of current $I_2$. The destretch pulse has the conventional waveform.

Figure 9:
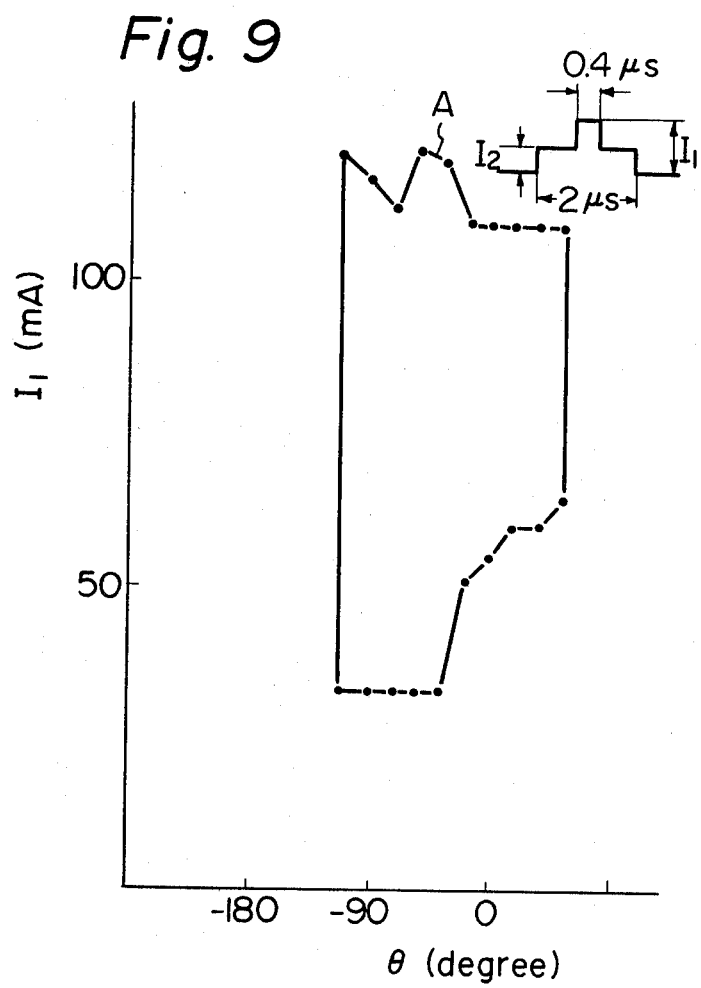
FIG. 9 is a graph illustrating the influence of the position of a main pulse of the convex-shaped pulse on current margin.

FIG. 9 is a graph showing the result of the study on the influence of the position of the main pulse $P_1$ on the current margin when the starting point of the stretch pulse (SPC) is fixed at −110° of the drive field. In this graph, the ordinate axis designates the main pulse current $I_1$ and the abscissa axis designates the phase $\theta$ of the drive field, and the relationship therebetween is shown by a curve A. The stretch pulse width is 2 μs, the main pulse $P_1$ width is 0.4 μs and the auxiliary pulse $P_2$ current $I_2$ is 30 mA. It can be understood from this graph that the position of the main pulse $P_1$ is preferred to be in a forward portion or before the auxiliary pulse $P_2$. Accordingly, the main pulse $P_1$ is located in a forward portion or in front of the auxiliary pulse $P_2$, as illustrated in FIG. 8, in the following examples.

Figure 10:
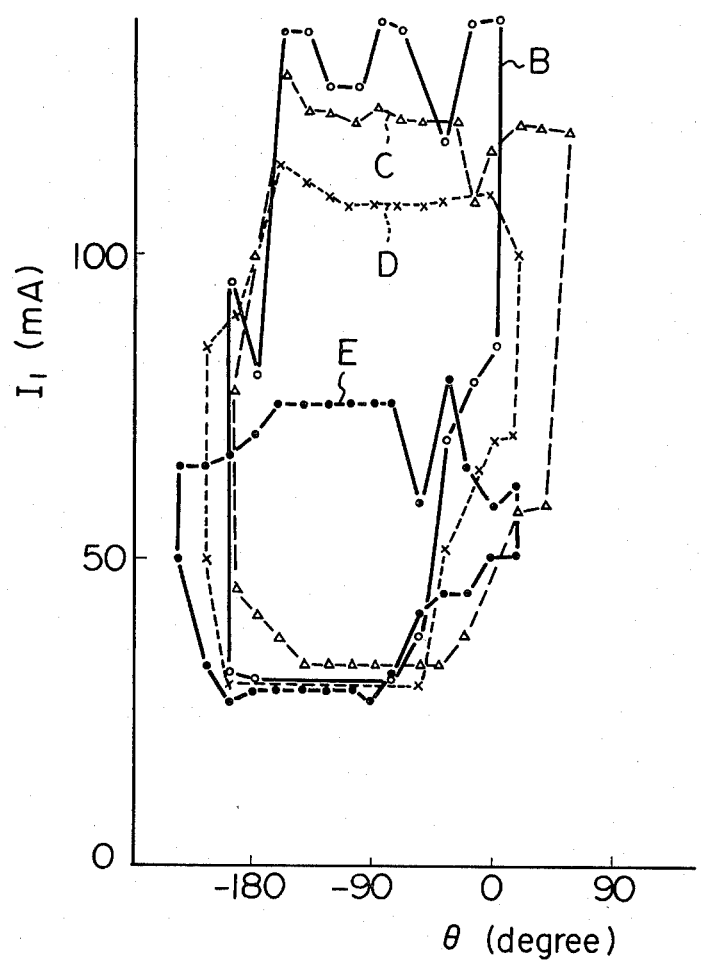
FIGS. 10 and 11 are graphs illustrating the current versus phase characteristics and the bias field versus phase characteristics, respectively, depending on variations of the main pulse width of the convex-shaped pulse.
Figure 11:
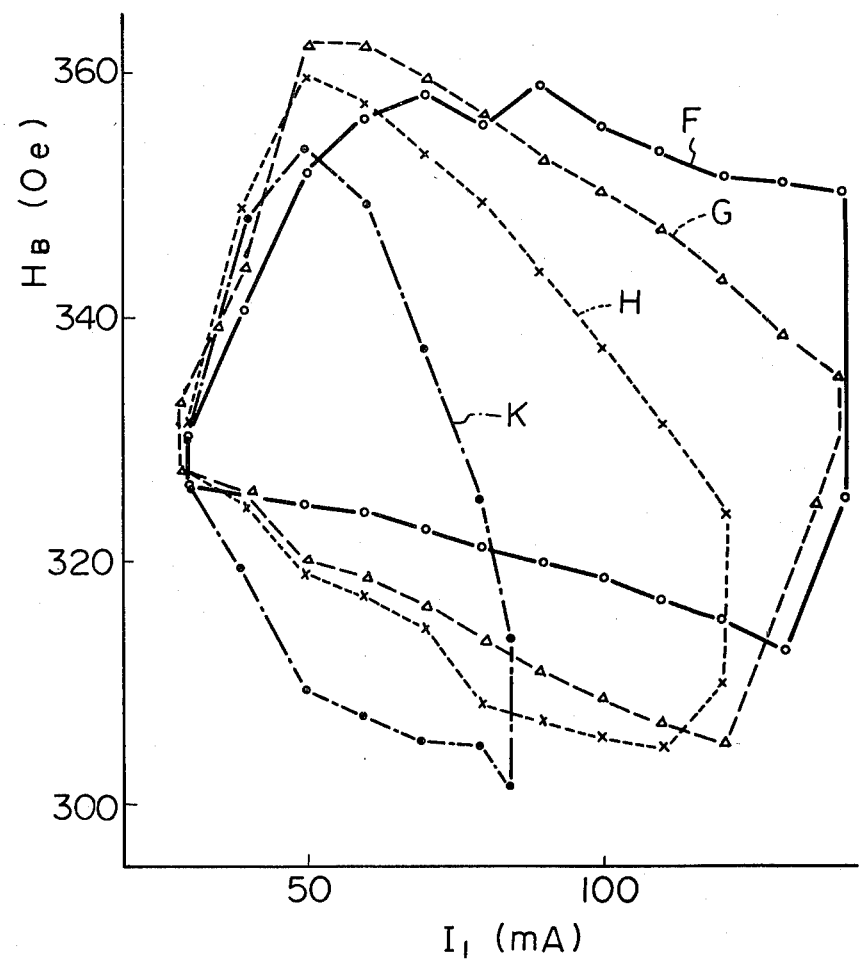

FIGS. 10 and 11 show the current versus phase characteristics and the bias field versus current characteristics, respectively, when the width of the auxiliary pulse is fixed at 2 μs and main pulse $P_1$ width is varied between 0.2 μs, 0.4 μs and 0.8 μs. In FIG. 10, the ordinate axis designates the current of the main pulse $P_1$ and the abscissa designates the angle of the drive field, and the curves B, C and D show the cases in which the main pulse $P_1$ widths are 0.2 μs 0.4 μs and 0.8 μs, respectively. In these cases, the current values of the auxiliary pulses $P_2$ are 30 mA. For the purpose of comparison, the curve E shows a conventional square-shaped pulse of 2.0 μs width. In FIG. 11, the curves F, G and H show situations in which the main pulse widths are 0.2, 0.4 and 0.8 μs, respectively. For the purpose of comparison, a conventional square-shaped pulse of 2.0 μs is shown by the curve K. In these examples, the current values of the auxiliary pulses $P_2$ are 30 mA. From these figures, it can be understood that the stretch pulse according to the present invention can increase the current margin and improve the upper limit of the bias field margin remarkably, as compared with the square-shaped pulse illustrated in FIGS. 6A and 6B.

Figure 12:
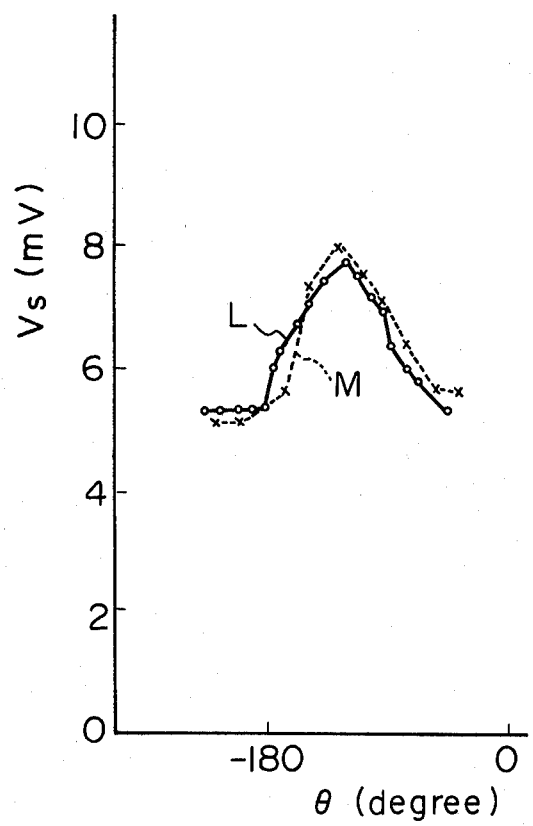
FIG. 12 is a graph illustrating comparatively the characteristics of the square-shaped pulse and of the convex-shaped pulse.

FIG. 12 shows comparatively the detection voltage versus phase characteristics based on the square-shaped and the pulses according to the present invention. The square-shaped pulse is shown by the curve M, in which the stretch pulse width is 2 μs and the current value is 55 mA. The present invention pulse is shown by the curve L, in which the stretch pulse width is 2 μs, the main pulse $P_1$ width is 0.4 μs, the main pulse $P_1$ current is 70 mA and the auxiliary pulse $P_2$ current is 30 mA. As can be understood from this figure, the detection voltage is substantially the same and, therefore, the pulse of the present invention can assure a high detection voltage and a high detection efficiency even at a high frequency.

Figure 13:
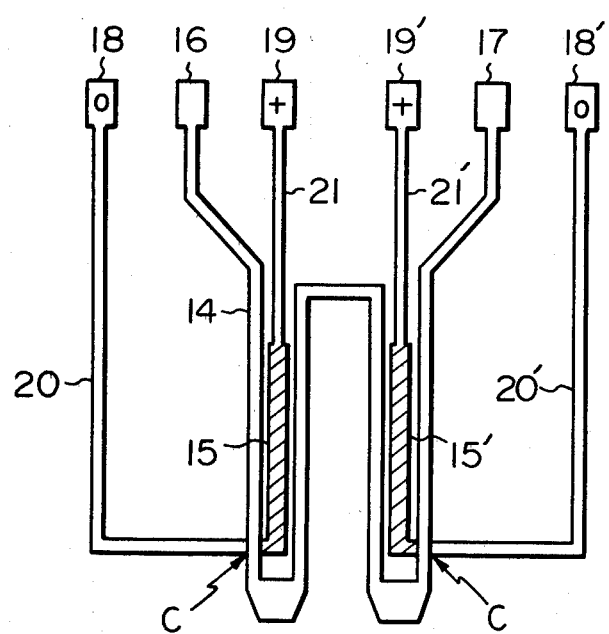
FIG. 13 is a plan view of an embodiment of a current stretcher detector according to the present invention.

FIG. 13 illustrates an embodiment of a current stretcher detector according to the present invention. This stretcher detector is basically similar to that described hereinbefore with reference to FIG. 3, except for the difference which will now be described below.

The illustrated embodiment has two detectors, one of which is a dummy. A stretch conductor 14 is hairpin-shaped, and Permalloy detecting elements 15 and 15' are centrally disposed in the hairpin loops in the stretch cnductor along the loop axis. The stretch conductor 14 is connected to terminals 16 and 17. The detecting elements 15 and 15' are connected to terminals 18 and 18' on the lower pontential side through leads 20 and 20' and to terminals 19 and 19' on the higher potential side through leads 21 and 21', respectively. The lower potential side terminals 18 and 18' are disposed at positions outside the terminals 16 and 17 of the stretcher conductor, respectively. The higher potential side terminals 19 and 19' are disposed between the terminals 16 and 17 of the stretch conductor. The leads 20 and 20' cross the stretch conductor 14 at the portion C. On the other hand, the leads 21 and 21' do not cross the stretch conductor 14.

In this arrangement, when a stretch pulse current is applied to the stretch conductor 14 for bubble detection, voltage of 1 to 1.5 V appears across each of the detecting conductors 15 and 15'. At this time, however, there is produced no significant potential difference at the crossing portion C, because it is located on the lower potential side. Moreover, the detecting elements 15 and 15' have no portion crossing the stretch conductor 14 on the higher potential side. Therefore, a breaking down of the insulating layer interposed between the stretch conductor 14 and the detecting elements 15 and 15' is not caused. Accordingly, the durability and the reliability of the bubble device are improved.

Figure 14A:
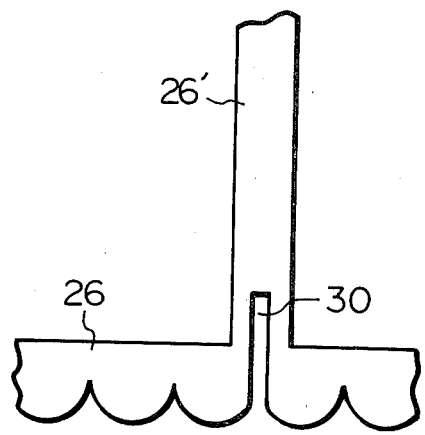
Figure 14B:
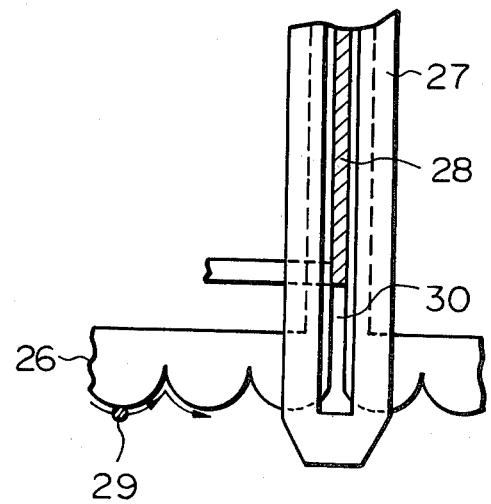

FIGS. 14A and 14B illustrate an embodiment of an ion-implanted bubble device with a current stretcher detector, according to the present invention. This device is substantially the same as that described hereinbefore with reference to the FIG. 4, except for the difference which will now be described below.

FIG. 14A illustrates a contiguous propagation pattern 26 and a straight bar-shaped pattern 26' of the ion-implanted bubble device, over which a hairpin-shaped stretch conductor 27 and a detecting element 28 are formed, as illustrated in FIG. 14B, in a conventional manner. The patterns 26 and 26' are defined by the ion-nonimplanted region. The contiguous propagation pattern 26 is provided with a notch 30 at the cusp in which the stretcher conductor 27 is located. The notch 30 is defined by the ion-implanted region and has a width substantially equal to the diameter of a bubble 29.

Figure 15:
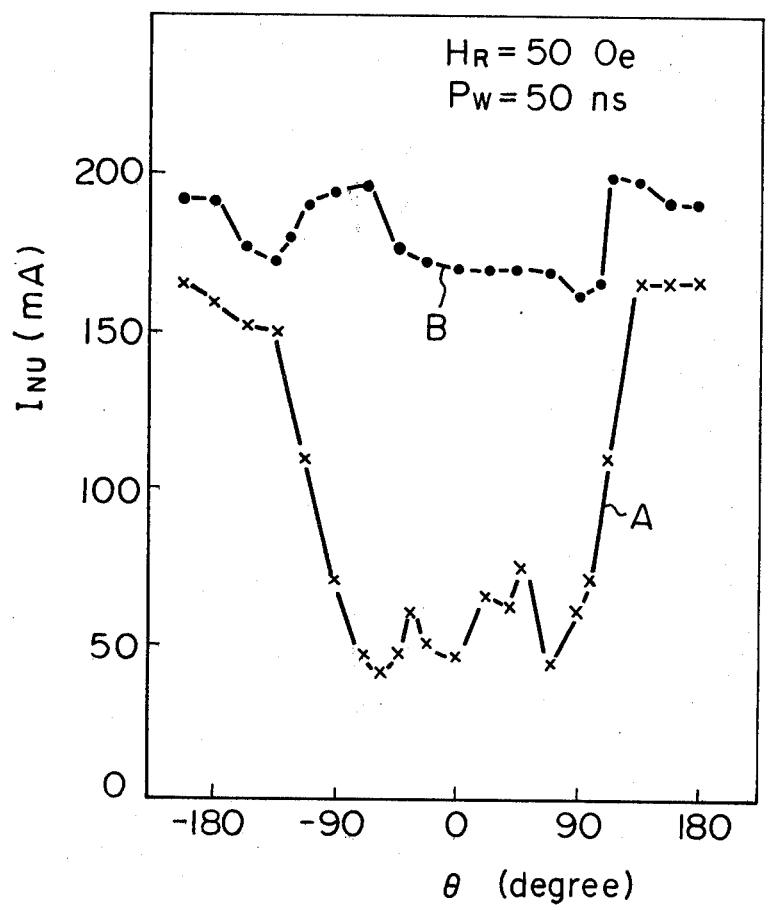
FIG. 15 is a graph illustrating comparatively the characteristics of the conventional current stretcher detector illustrated in FIG. 4 and that of the present invention illustrated in FIG. 14.

According to this construction, nucleation of the bubble, which is caused by a stretch current applied to the stretcher conductor 27, can be effectively prevented. FIG. 15 shows the nucleation current versus the phase characteristics of the bubble device illustrated in FIGS. 14A and 14B, in contrast with that of the conventional bubble device illustrated in FIG. 4, wherein the drive field $H_R = 50$ Oe and the pulse width $P_W = 50$ ns. It will be understood from this graph that the minimum nucleation current of the device according to the present invention (curve B) is much larger than that of the conventional device (curve A).

We claim:

1. A method of bubble detection for a magnetic bubble memory device, said magnetic bubble memory device comprising: a bubble propagation pattern in which bubbles are written at least one bit apart and moved therealong successively bit by bit in response to a rotating drive field; and a stretcher detector, including: a stretch conductor associated with said propagation pattern; and a detecting element; said method comprising:

applying a bubble control current pulse which stretches and de-stretches the bubble to said stretch conductor in conjunction with at least two cycles of the rotating drive field and stretching a leading bubble which reaches the detection position; and detecting the stretched bubble by means of said detecting element;

said bubble control current pulse is applied to the stretch conductor so that the leading bubble which reaches the detection position is, when detected, maintained stretched, even though a following bubble has moved one bit.

2. A method of bubble detection according to claim 1, wherein the bubble control current pulse comprises a main pulse and an auxiliary pulse.

3. A method of bubble detection according to claim 2, wherein the main pulse has a first current value and the auxiliary pulse has a second current value lower than the first current value, the main pulse being before the auxiliary pulse.

4. A method of bubble detection according to claim 1, wherein said stretch conductor is hairpin-shaped.

5. A method of bubble detection according to claim 4, wherein said stretch conductor has a hairpin loop axis and said detecting element has a leg on a higher potential side running parallel to the hairpin loop axis.

6. A magnetic bubble memory device, comprising:
a bubble propagation pattern in which bubbles are written and moved therealong; and
a stretcher detector, including:
a hairpin-shaped stretch conductor having a hairpin loop axis and associated with the propagation pattern and operative, when applied with a stretch current, to stretch a bubble; and
a detecting element disposed centrally in the stretch conductor for detecting the stretched bubble by utilizing a magnetoresistance effect, and having a leg on a higher potential side, the leg of the detecting element on the higher potential side running parallel to the hairpin loop axis, so that the leg on the higher potential side does not cross the stretch conductor.

7. A magnetic bubble device, comprising:
a continguous propagation pattern for bubbles in which bubbles are written and moved therealong; and
a stretcher detector, including:
a hairpin-shaped stretch conductor having a hairpin loop axis and associated with the propagation pattern at a position and operative, when applied with a stretch current, to stretch a bubble; and
an element disposed centrally in the stretch conductor for detecting the stretched bubble by utilizing a magnetoresistance effect and having a leg on a higher potential side running parallel to the hairpin loop axis;
said contiguous propagation pattern having a notch at the position in which the stretch conductor is located.

* * * * *

UNITED STATES PATENT AND TRADEMARK OFFICE
CERTIFICATE OF CORRECTION

PATENT NO. : 4,445,200
DATED : April 24, 1984
INVENTOR(S) : Makoto Ohashi et al

It is certified that error appears in the above-identified patent and that said Letters Patent is hereby corrected as shown below:

Column 3, line 2, "expitaxial" should be --epitaxial--;
line 41, "aroow" should be --arrow--.

Column 6, line 44, after "0.2 µs", insert --,--.

Column 7, line 14, "cnductor" should be --conductor--;
line 17, "pontential" should be --potential--.

Signed and Sealed this

Thirtieth Day of October 1984

[SEAL]

Attest:

Attesting Officer

GERALD J. MOSSINGHOFF

Commissioner of Patents and Trademarks